United States Patent
Lou

(10) Patent No.: US 11,965,912 B2
(45) Date of Patent: Apr. 23, 2024

(54) PROBE CARD DEVICE HAVING A PROBE STRUCTURE WITH A PROTRUSION PORTION

(71) Applicant: teCat Technologies (Suzhou) Limited, Suzhou (CN)

(72) Inventor: Choon Leong Lou, Suzhou (CN)

(73) Assignee: XINGR TECHNOLOGIES (ZHEJIANG) LIMITED, Zhejiang (CN)

( * ) Notice: Subject to any disclaimer, the term of this patent is extended or adjusted under 35 U.S.C. 154(b) by 0 days.

(21) Appl. No.: 17/397,471

(22) Filed: Aug. 9, 2021

(65) Prior Publication Data
US 2022/0341969 A1  Oct. 27, 2022

(30) Foreign Application Priority Data
Apr. 27, 2021 (CN) .......................... 202110458967.4

(51) Int. Cl.
*G01R 1/073* (2006.01)

(52) U.S. Cl.
CPC ................................ *G01R 1/07371* (2013.01)

(58) Field of Classification Search
CPC ................ G01R 1/07371; G01R 1/073; G01R 1/07307; G01R 1/07314
See application file for complete search history.

(56) References Cited

U.S. PATENT DOCUMENTS

2020/0292576 A1* 9/2020 Perego ............... G01R 31/2886
2021/0373048 A1* 12/2021 Chen ..................... G01R 1/0675

FOREIGN PATENT DOCUMENTS

| JP | 201844912 | * | 3/2018 |
| TW | I640782 B | | 11/2018 |
| TW | 201918710 A | | 5/2019 |
| TW | M603961 U | | 11/2020 |

OTHER PUBLICATIONS

English machine translation of Yokoyama JP 2018-44912 (Yokoyama). (Year: 2018).*
Taiwan Patent Office, Office action dated Sep. 7, 2023.

* cited by examiner

*Primary Examiner* — Lee E Rodak
(74) *Attorney, Agent, or Firm* — Li & Cai Intellectual Property (USA) Office

(57) ABSTRACT

A probe card device including a probe structure is provided. Probes respectively pass through multiple through holes on at least two guide plates that are stacked and separated from each other, and each of the probes includes a main body, a contacting portion, a head portion, and a neck portion. The contacting portion is exposed under a lowermost guide plate. The head portion is exposed above an uppermost guide plate. The neck portion is connected between the main body and the head portion, and a part of the neck portion protrudes opposite thereof to form a protrusion portion. The protrusion portion and the main body form an included angle, the protrusion portion abuts against an upper surface of the uppermost guide plate, and a spacing between any two of the probes that are adjacent to each other is less than twice the thickness of the protrusion portion.

7 Claims, 9 Drawing Sheets

PROBE CARD DEVICE HAVING A PROBE STRUCTURE WITH A PROTRUSION PORTION

CROSS-REFERENCE TO RELATED PATENT APPLICATION

This application claims the benefit of priority to China Patent Application No. 202110458967.4, filed on Apr. 27, 2021 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe structure and a probe card device, and more particularly to a probe structure that reduces spacing between probes and a probe card device.

BACKGROUND OF THE DISCLOSURE

An electrical testing of an integrated circuit chip is quite essential during a manufacturing process of the integrated circuit chip. When the integrated circuit chip is being tested, an electronic test system transmits electrical signals through a probe card device contacting a device under test, and then the electronic test system analyzes the received electrical signals from the device under test to perform the electrical testing, so as to determine whether or not a manufacturing quality of the device under test is qualified.

In regards to the probe card device, a spacing between the probes affects an efficiency of the testing. If the spacing between the probes is smaller, a quantity of the probes on the probe card device is higher (that is, more probes can be accommodated per unit area), which is beneficial for testing electronic components with higher contact density. However, conventional probes are limited by a size of a latch structure that is attached onto a guide plate, and the spacing between the probes cannot be further reduced.

Therefore, how to reduce the spacing between the probes and increase the quantity of the probes on the probe card device through a structural design of the probe structure to overcome the abovementioned shortcomings has become one of the important issues to be solved in this industry.

SUMMARY OF THE DISCLOSURE

In response to the above-referenced technical inadequacies, the present disclosure provides a probe structure and a probe card device.

In one aspect, the present disclosure provides a probe structure, which includes a main body, a contacting portion, a head portion, and a neck portion. The contacting portion is connected to one end of the main body, and the head portion is connected to another end of the main body. The neck portion is connected between the main body and the head portion. A part of the neck portion protrudes opposite to the main body and the head portion to form a protrusion portion, and the protrusion portion is asymmetrically disposed in an opposite direction of the main body.

In another aspect, the present disclosure provides a probe card device, which includes at least one upper guide plate, at least one lower guide plate, and a plurality of probes. The at least one upper guide plate has a plurality of first through holes. The at least one lower guide plate is disposed under and parallel to the at least one upper guide plate, and the at least one lower guide plate has a plurality of second through holes. The first through holes respectively correspond to the second through holes. The probes respectively pass through the first through holes and the second through holes. Each of the probes includes a main body, a contacting portion, a head portion, and a neck portion. The contacting portion is connected to one end of the main body and exposed under the at least one lower guide plate. The head portion is connected to another end of the main body and exposed above the at least one upper guide plate. The neck portion is connected between the main body and the head portion, and the neck portion is exposed above the at least one upper guide plate. A part of the neck portion protrudes opposite to the main body and the head portion to form a protrusion portion, the protrusion portion and the main body form an included angle, and the protrusion portion is asymmetrically disposed in an opposite direction of the main body. The protrusion portion has a thickness, and a spacing between any two of the probes that are adjacent to each other is less than twice the thickness of the protrusion portion.

Therefore, one of the beneficial effects of the present disclosure is that, in the probe structure and the probe card device provided herein, by virtue of "a part of the neck portion protruding opposite to the main body and the head portion, and the neck portion forming a protrusion portion, the protrusion portion being asymmetrically disposed in an opposite direction of the main body" and "the protrusion portion having a thickness, and a spacing between any two of the probes being adjacent to each other being less than twice the thickness of the protrusion portion", the spacing between the probes can be reduced and a quantity of the probes on the probe card device can be increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
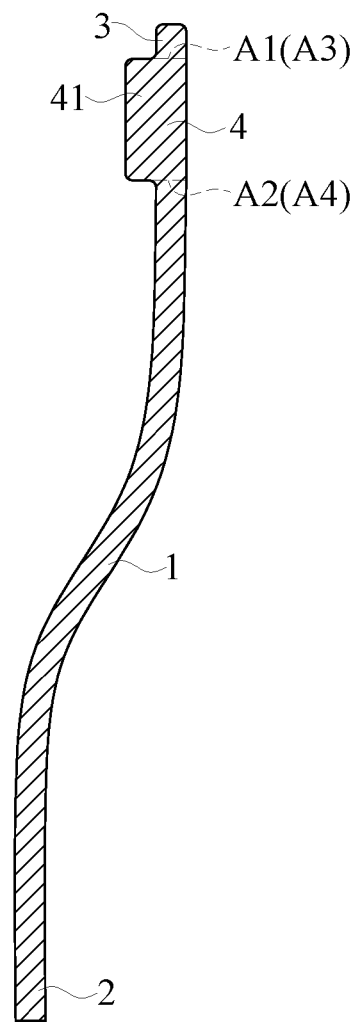
FIG. 1 is a cross sectional view of an implementation aspect of a probe structure according to a first embodiment of the present disclosure.
Figure 2:
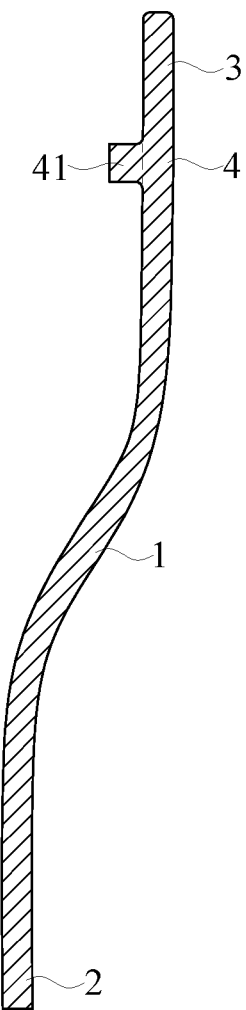
FIG. 2 is a cross sectional view of another implementation aspect of the probe structure according to the first embodiment of the present disclosure.
Figure 3:
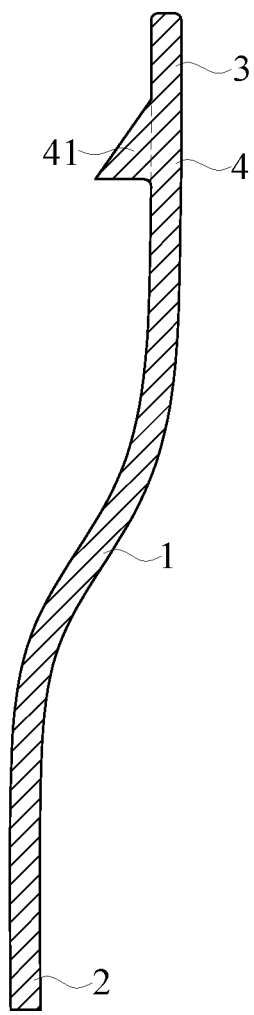
FIG. 3 is a cross sectional view of yet another implementation aspect of the probe structure according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which shows a first embodiment of the present disclosure providing a probe S of a probe structure. The probe S includes a main body 1, a contacting portion 2, a head portion 3, and a neck portion 4. More specifically, the main body 1, the contacting portion 2, the head portion 3, and the neck portion 4 respectively refer to different sections of the probe S. The contacting portion 2 is connected to one end of the main body 1, and the head portion 3 is connected to another end of the main body 1. The neck portion 4 is connected between the main body 1 and the head portion 3, and a part of the neck portion 4 protrudes opposite to the main body 1 and the head portion 3 to form a protrusion portion 41. The protrusion portion 41 is asymmetrically disposed in an opposite direction of the main body 1. It should be noted that, the protrusion portion 41 that is asymmetrically disposed can be, for example, the protrusion portion 41 that only protrudes in a fixed direction to form an included angle with the main body 1. As seen from the appearance (shown in FIG. 1), the protrusion portion 41 is only formed on one side of the probe S. In comparison, a latch on the conventional probe structures are all symmetrically disposed, and since the protrusion portion 41 of the probe S provided by the present disclosure is asymmetrically disposed, the protrusion portion 41 can only be formed on one side of the probe structure. Therefore, an overall volume of the probe S can be effectively reduced.

Figure 4:
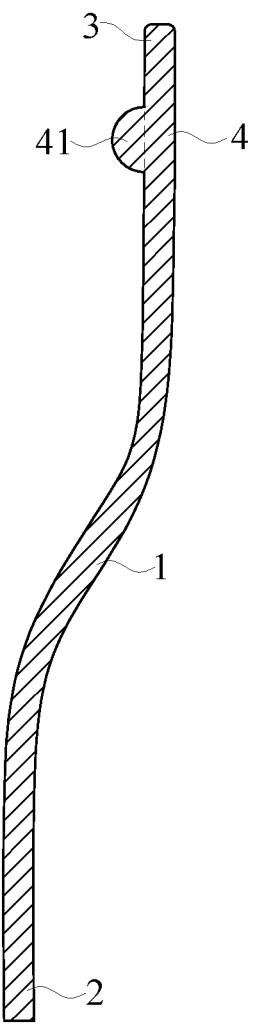
FIG. 4 is a cross sectional view of still yet another implementation aspect of the probe structure according to the first embodiment of the present disclosure.

Next, referring to FIG. 1 to FIG. 4, the present disclosure is not limited to a shape of the protrusion portion 41. In detail, a specific structure of the protrusion portion 41 can be adjusted and changed according to a requirement of a designer. The possible implementation aspects of the protrusion portion 41 of the embodiment are listed below, but the present disclosure is not limited thereto. For example, the shape of the protrusion portion 41 can be rectangular (FIG. 1), square (FIG. 2), triangular (FIG. 3), or elliptical (FIG. 4). In addition, it is worth nothing that the main body 1, the contacting portion 2, the head portion 3, and the neck portion 4 is a one piece structure formed of metal conductors, but the present disclosure is not limited to a method of formation. For example, the main body 1, the contacting portion 2, the head portion 3, and the neck portion 4 can be formed through molding or laser cutting metal conductors.

In addition, it should be noted that the structures shown in the drawings (FIG. 1 to FIG. 8) of the present disclosure are cross sectional views, such that the areas mentioned in the specification (including a connection area and a cross sectional area that will be mentioned below) are represented by line segments in the drawings.

Reference is further made to FIG. 1, a connection between the neck portion 4 and the head portion 3 has a first connection area A1, and a connection between the neck portion 4 and the main body 1 has a second connection area A2. In this embodiment, the first connection area A1 is preferably equal to the second connection area A2. Furthermore, in this embodiment, the first connection area A1 is equal to a cross sectional area of the head portion A3, and the second connection area A2 is equal to a cross sectional area of the main body A4. It is also worth mentioning that, the cross sectional area of the head portion A3 is less than or equal to the cross sectional area of the main body A4.

Figure 5:
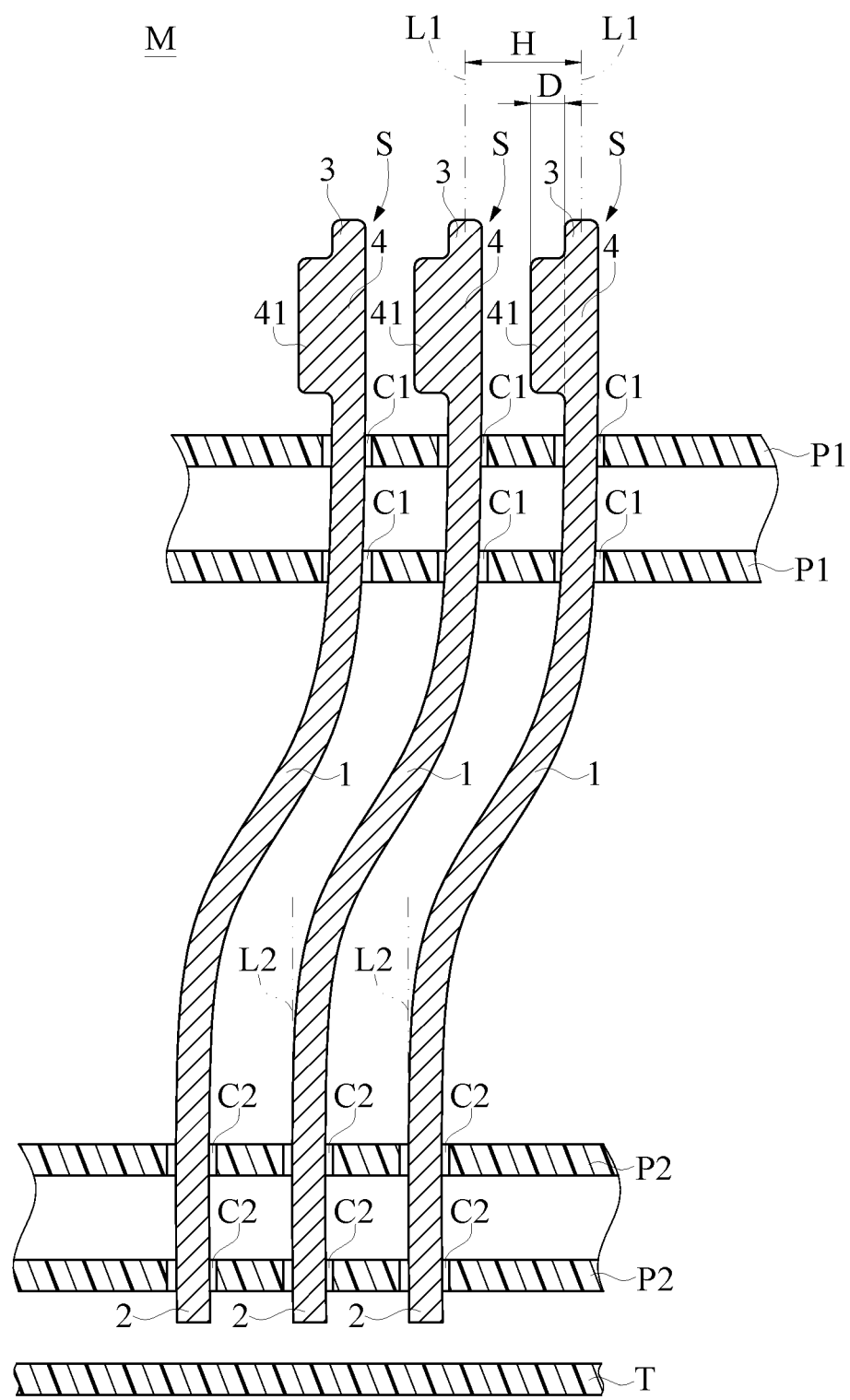
FIG. 5 is a cross sectional view of an implementation aspect of a probe card device according to the first embodiment of the present disclosure.

Referring to FIG. 5, the first embodiment of the present disclosure further provides a probe card device M. The probe card device M mainly includes at least one upper guide plate P1, at least one lower guide plate P2, and a plurality of probes S. The at least one upper guide plate P1 has a plurality of first through holes C1. The at least one lower guide plate P2 is disposed under and parallel to the at least one upper guide plate P1. The at least one lower guide plate P2 has a plurality of second through holes C2, and the first through holes C1 respectively correspond to the second through holes C2. A specific structure and implementation aspect of the probes S can be seen in FIG. 1 to FIG. 4. Each of the probes S includes the main body 1, the contacting portion 2, the head portion 3, and the neck portion 4. The contacting portion 2 is connected to one end of the main body 1, the head portion 3 is connected to another end of the main body 1, and the neck portion 4 is connected between the main body 1 and the head portion 3. A part of the neck portion 4 protrudes opposite to the main body 1 and the head portion 3 to form a protrusion portion 41, and the protrusion portion 41 is asymmetrically disposed in an opposite direction of the head portion 3.

The plurality of probes S respectively pass through the first through holes C1 of the at least one upper guide plate P1 and the second through holes C2 of the at least one lower guide plate P2. Specifically speaking, since the at least one upper guide plate P1 is disposed above the at least one lower guide plate P2, each of the probes S can pass from top to bottom through corresponding one of the first through holes C1 and one of the second through holes C2. The contacting portion 2 of one of the probes S can be exposed under the at least one lower guide plate P2 to contact a device under test T, and the head portion 3 and the neck portion 4 can be exposed above the at least one upper guide plate P1. In this embodiment, two upper guide plates P1 and two lower guide plates P2 are used as an example. As shown in FIG. 5, after the probes S pass through two layers of the upper guide plates P1 and two layers of the lower guide plates P2, the contacting portion 2 can be exposed below a lowermost layer of the lower guide plate P2, the head portion 3 and neck portion 4 can be exposed above an uppermost layer of the upper guide plate P1, and the main body 1 can be located between the upper guide plate P1 and the lower guide plate P2.

That is to say, each of the probes S sequentially form the head portion 3, the neck portion 4, the main body 1, and the contacting portion 2 along the guide plates (the upper guide plate P1 and the lower guide plate P2) facing the device under test T in a linear direction (from top to bottom as shown in FIG. 5). When the probes S pass through the first through holes C1 of the upper guide plate P1 and the corresponding second through holes C2 of the lower guide plate P2, the contacting portion 2 can pass through the second through holes C2 to contact the device under test T. The device under test T can be, for example, but not limited to an IC chip on a wafer. The contacting portion 2 directly contacts a pad and a bump on the chip (not shown in figures), so as to probe each chip on the wafer by using the probe. That is, signals from the chip are extracted and data from the signals of the chip are transferred to the test system for analysis and determination.

Reference is further made to FIG. 5, in which the probes S abut against an upper surface of the uppermost layer of the upper guide plate P1 through the protrusion portion 41 of the neck portion 4, so that the probes S are fixed onto the guide plates (the upper guide plate P1 and the lower guide plate P2) to prevent the probes S from passing through the first through holes C1 and the second through holes C2 and then falling off from the probe card device M. The protrusion portion 41 has a thickness D, and the thickness D is a distance between one end of the protrusion portion 41 and one side surface of the head portion 3. Furthermore, the head portion 3 defines a central axis L1 along an elongated direction of one of the probes S, the contacting portion 2 defines a tangent line L2 along the elongated direction of one of the probes S, and a distance between any two of the central axes L1 that are adjacent to each other is equal to a distance between any two of the tangent lines L2 that are adjacent to each other. That is to say, the probes S are arranged at intervals and fixed onto the guide plates (the upper guide plate P1 and the lower guide plate P2). A spacing H is formed between any two of the probes S that are adjacent to each other, and the spacing H refers to the distance between any two of the central axes L1. The spacing H between any two of the probes S that are adjacent to each other is preferably less than twice the thickness D of the protrusion portion 41.

It is worth mentioning that, in comparison with conventional probe card devices, the latches on the probe structure are all symmetrically disposed, and since the protrusion portion 41 of the probe S provided by the present disclosure is asymmetrically disposed, the protrusion portion 41 can only be formed on one side of the probe structure. Therefore, when the probes S are arranged at intervals and fixed between the guide plates (the upper guide plate P1 and the lower guide plate P2), not only can an overall volume of the probe S be reduced, but also the spacing H between any two of the probes S that are adjacent to each other can be shortened, so that a quantity of the probes on the probe card device M can be increased. For example, a spacing between any two of the probes S that are adjacent to each other on the probe card device M in the conventional technology is generally about 50 μm to 100 μm, whereas the spacing H between any two of the probes S that are adjacent to each other on the probe card device M of the present disclosure can be further shortened to 45 μm or less than 45 μm.

Figure 6:
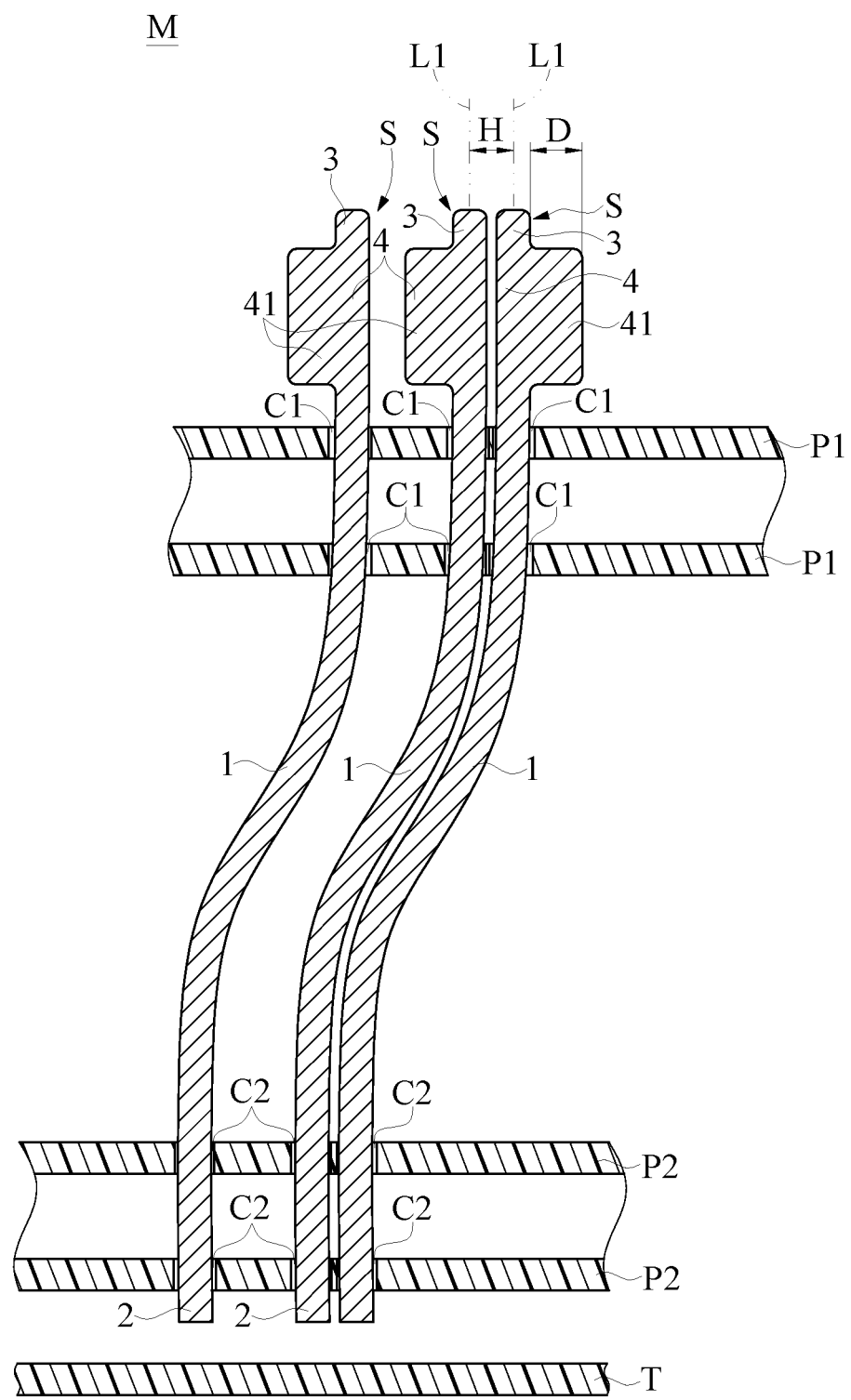
FIG. 6 is cross sectional view of another implementation aspect of the probe card device according to the first embodiment of the present disclosure.

Reference is made to FIG. 6, which shows a cross sectional view of another embodiment of the probe card device according to the first embodiment of the present disclosure. As seen from FIG. 6, the protrusion portions 41 of two of the probes S of the probe card device M are arranged in different directions. That is, the protrusion portions 41 are located on different sides. In other words, the present disclosure is not limited to the direction of arrangement of the protrusion portions 41. Furthermore, the protrusion portions 41 of two of the probes S respectively protrude in opposite directions, and the spacing H between the two of the probes S is not limited by the protrusion portions 41, so that the spacing H can be further shortened. In the embodiment shown in FIG. 6, the spacing H between any two of the probes S that are adjacent to each other is preferably less than the thickness D of the protrusion portion 41, that is, H<D. As a result, when the spacing between two of the probes S is further shortened, the quantity of the probes on the probe card device M is further increased.

Second Embodiment

Figure 7:
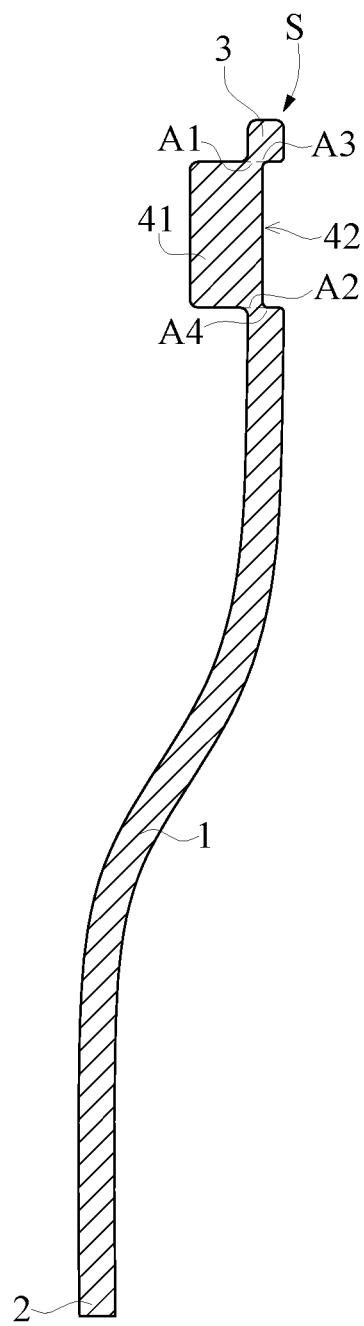
FIG. 7 is a cross sectional view of the probe structure according a second embodiment of the present disclosure.

Reference is made to FIG. 7, which shows a cross sectional view of the probe structure according to a second embodiment of the present disclosure. Comparing FIG. 7 with FIG. 1, a main difference between the probe structure of the second embodiment and the first embodiment is that another part of the neck portion 4 is recessed opposite to the main body 1 and the head portion 3 to form a recessed portion 42. More specifically, the probe structure of the second embodiment of the present disclosure mainly includes the main body 1, the contacting portion 2, the head portion 3, and the neck portion 4. The contacting portion 2 is connected to one end of the main body 1, and the head portion 3 is connected to another end of the main body 1. The neck portion 4 is connected between the main body 1 and the head portion 3. One part of the neck portion 4 protrudes opposite to the main body 1 and the head portion 3 to form the protrusion portion 41, and another part of the neck portion 4 is recessed opposite to the main body 1 and the head portion 3 to form the recessed portion 42. The protrusion portion 41 is asymmetrically disposed in the opposite direction of the head portion 3, that is, the protrusion portion 41 on the probe structure can only be formed on one side of the probe structure, and the recessed portion 42 is disposed on an opposite side of the one side of the probe structure in which the protrusion portion 41 is formed. In other words, the protrusion portion 41 and the recessed portion 42 are respectively disposed on two opposite sides of the probe structure. A structural design of the recessed portion 42 is intended to appropriately reduce the volume of the neck portion 4 of the probe S structure, so as to reduce a requirement of material cost for manufacturing the probes S.

Reference is further made to FIG. 7, the connection between the neck portion 4 and the head portion 3 has the first connection area A1, and the connection between the neck portion 4 and the main body 1 has the second connection area A2. In this embodiment, the first connection area A1 is preferably equal to the second connection area A2, the first connection area A1 is preferably less than the cross sectional area of the head portion A3, and the second connection area A2 is preferably less than the cross sectional area of the main body A4. It is worth mentioning that, the cross sectional area of the head portion A3 is less than or equal to the cross sectional area of the main body A4.

Figure 8:
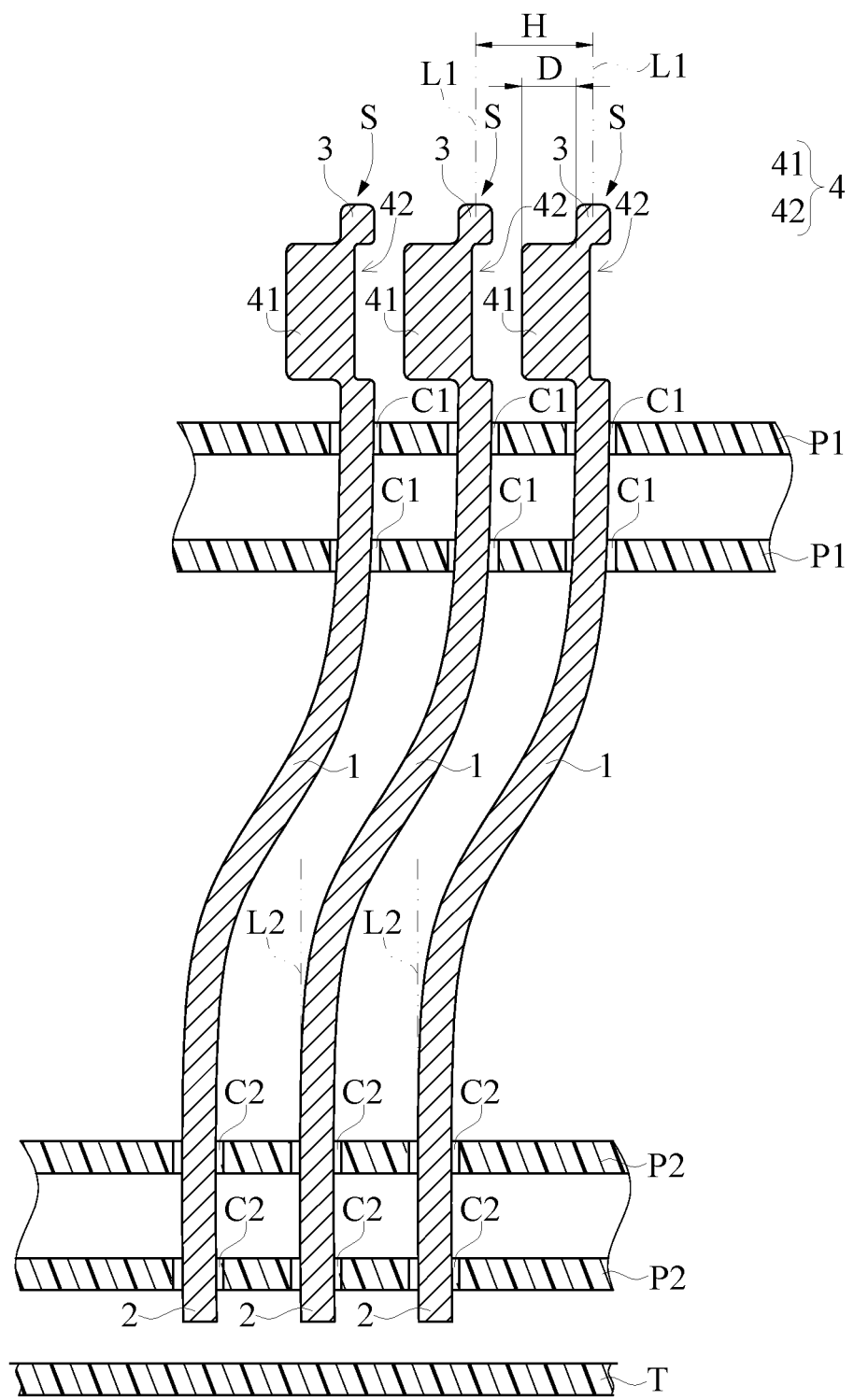
FIG. 8 is a cross sectional view of an implementation aspect of the probe card device according to the second embodiment of the present disclosure.

Next, reference is made to FIG. 8, which shows a cross sectional view of an implementation aspect of the probe card device according to the second embodiment of the present disclosure. The second embodiment of the present disclosure provides another probe card device M, which mainly includes at least one upper guide plate P1, at least one lower guide plate P2, and a plurality of probes S. The specific structure of the probes S can be referred to as shown in FIG. 6, such that the probe structure has already been described in detail in the abovementioned paragraphs and will not be reiterated herein. The at least one upper guide plate P1 has a plurality of first through holes C1. The at least one lower guide plate P2 is disposed under and parallel to the at least one upper guide plate P1, the at least one lower guide plate P2 has a plurality of second through holes C2, and the first through holes C1 respectively correspond to the second through holes C2.

Reference is further made to FIG. 8, the probes S are arranged at intervals and fixed onto the guide plates (the upper guide plate P1 and the lower guide plate P2), and the protrusion portion 41 of one of the probes S is located on a same side while the recessed portion 42 is located on another side. For this reason, the probes S abut against the upper surface of the uppermost layer of the upper guide plate P1 through the protrusion portion 41 of the neck portion 4, so that the probes S can be fixed onto the guide plates. The probes S can be prevented from passing through the first through holes C1 and the second through holes C2 and then falling off from the probe card device M. Any two of the probes S that are adjacent to each other have the spacing H. The spacing H between any two of the probes S that are adjacent to each other is preferably less than twice the thickness D of the protrusion portion 41, that is, H<2D.

Figure 9:
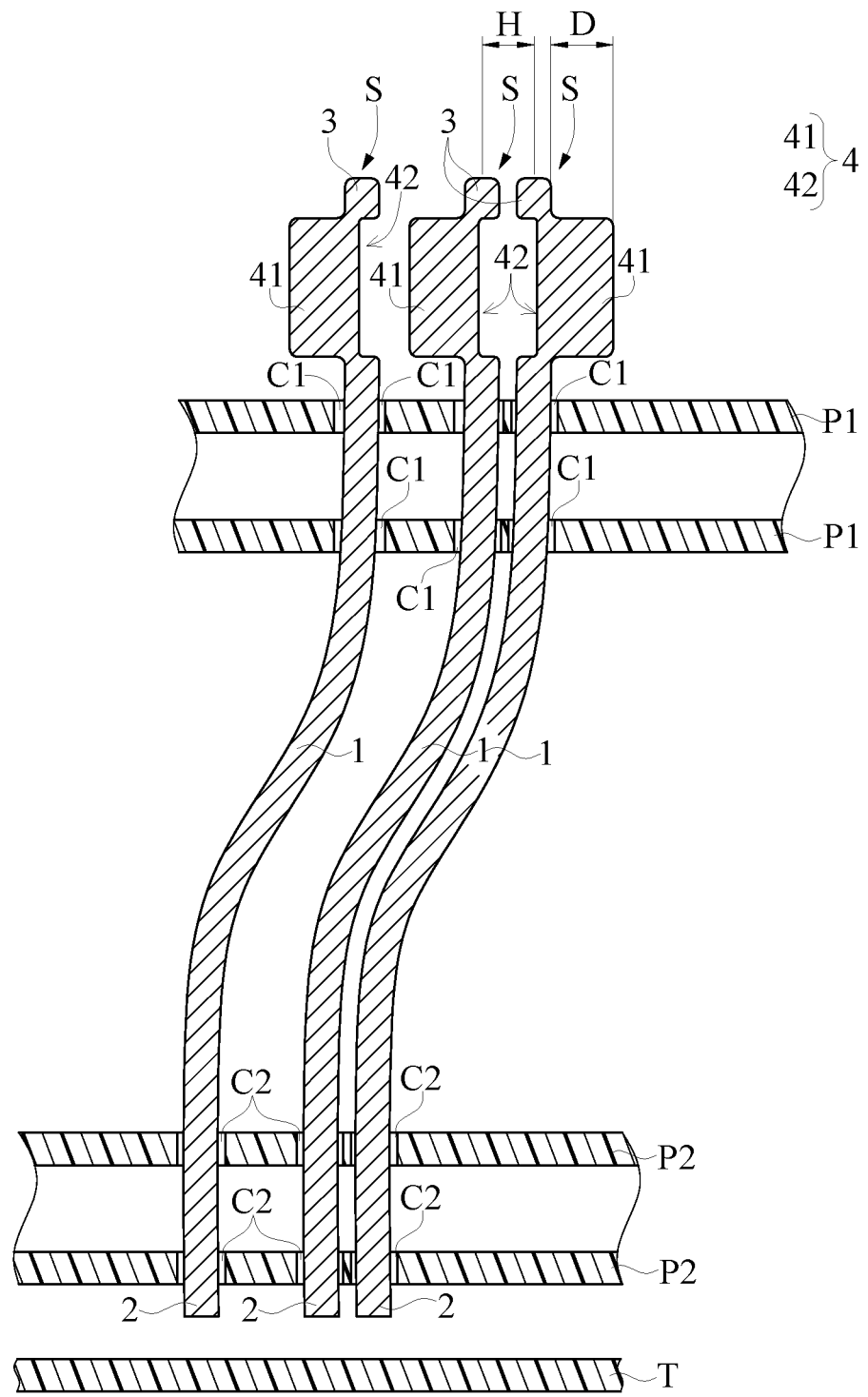
FIG. 9 is a cross sectional view of another implementation aspect of the probe card device according to the second embodiment of the present disclosure.

In continuation of the above, the present disclosure is not limited to the direction of arrangement of the protrusion portion 41 (or the recessed portion 42). Reference is made to FIG. 9, which shows a cross sectional view of another implementation aspect of the probe card device according to the second embodiment of the present disclosure. In FIG. 9, it can be seen that the direction of arrangement of the protrusion portion 41 of two of the probes S are different, that is, the protrusion portion 41 is located on different sides (or the recessed portion 42 is located on different sides). To be more specific, the recessed portion 42 of two of the probes S face each other, and the spacing H between two of the probes S is not limited by the protrusion portion 41, so that the spacing H can be further shortened. Therefore, in FIG. 9 of the present embodiment, the spacing between two of the probes S is smaller than the thickness D of the protrusion portion 41, that is, H<D. For this reason, the spacing between two of the probes S is further shortened, and the quantity of the probes on the probe card device M is further increased.

Beneficial Effects of the Embodiments

In conclusion, one of the beneficial effects of the present disclosure is that, in the probe S structure and the probe card device M, by virtue of "one part of the neck portion 4 protruding opposite to the main body 1 and the head portion 3, and the neck portion 4 forming a protrusion portion 41, the protrusion portion being asymmetrically disposed in an opposite direction of the head portion 3" and "the protrusion 41 having a thickness D, and a spacing between any two of the probes S being adjacent to each other being less than twice the thickness D of the protrusion portion 41", the spacing between the probes can be reduced and the quantity of the probes on the probe card device can be increased.

More specifically, the protrusion portion 41 of the probes S can be located on different sides, for example, the protrusion portion 41 of any two of the probes S that are adjacent to each other respectively protrude in opposite directions. At this time, the spacing between any two of the probes S that are adjacent to each other can be further shortened. Preferably, the spacing H between any two of the probes S that are adjacent to each other can be smaller than the thickness D of the protrusion portion 41.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
   at least one upper guide plate, the at least one upper guide plate having a plurality of first through holes;
   at least one lower guide plate, the at least one lower guide plate being disposed under and parallel to the at least one upper guide plate, wherein the at least one lower guide plate has a plurality of second through holes, and the first through holes respectively correspond to the second through holes; and
   a plurality of probes respectively passing through the first through holes and the second through holes, each of the probes including:
   a main body;
   a contacting portion connected to one end of the main body, the contacting portion being exposed under the at least one lower guide plate;
   a head portion connected to another end of the main body, the head portion being exposed above the at least one upper guide plate; and
   a neck portion connected between the main body and the head portion, the neck portion being exposed above the at least one upper guide plate,
   wherein each of any two of the probes that are adjacent to each other has a protrusion portion formed only on one side of the neck portion faced away from each other, another side of the neck portion of each of any two of the probes is not provided with a protruding object, the protrusion portion and the main body form an included angle, and the protrusion portion is asymmetrically disposed in an opposite direction of the main body;

wherein the protrusion portion has a thickness, and a spacing between any two of the probes that are adjacent to each other is less than the thickness of the protrusion portion;

wherein a width of the neck portion along a protrusion direction is greater than a width of the first through hole, wherein the another side of the neck portion is recessed to form a recessed portion.

2. The probe card device according to claim 1, wherein a shape of the protrusion portion is triangular, square, rectangular, circular, or elliptical.

3. The probe card device according to claim 1, wherein the main body, the contacting portion, the head portion, and the neck portion are a one piece structure.

4. The probe card device according to claim 1, wherein a connection between the neck portion and the head portion has a first connection area, a connection between the neck portion and the main body has a second connection area, and the first connection area is equal to the second connection area.

5. The probe card device according to claim 4, wherein the first connection area is less than or equal to a cross sectional area of the head portion, and the second connection area is less than or equal to a cross sectional area of the main body.

6. The probe card device according to claim 5, wherein the cross sectional area of the head portion is less than or equal to the cross sectional area of the main body.

7. The probe card device according to claim 1, wherein the head portion defines a central axis along an elongated direction of one of the probes, the contacting portion defines a tangent line along the elongated direction of the one of the probes, and a spacing between any two of the central axes that are adjacent to each other is equal to a spacing between any two of the tangent lines that are adjacent to each other.

* * * * *